United States Patent
Chen et al.

(10) Patent No.: US 12,068,742 B2
(45) Date of Patent: Aug. 20, 2024

(54) SHORT-CIRCUIT PROTECTION CIRCUITRY

(71) Applicant: LEAP Semiconductor Corp., Taoyuan (TW)

(72) Inventors: Wei-Fan Chen, Taichung (TW); Kuo-Chi Tsai, Taoyuan (TW)

(73) Assignee: LEAP Semiconductor Corp., Taoyuan (TW)

( * ) Notice: Subject to any disclaimer, the term of this patent is extended or adjusted under 35 U.S.C. 154(b) by 286 days.

(21) Appl. No.: 17/864,430

(22) Filed: Jul. 14, 2022

(65) Prior Publication Data

US 2024/0007095 A1    Jan. 4, 2024

(30) Foreign Application Priority Data

Jun. 29, 2022   (TW) .................................. 111124378

(51) Int. Cl.
| | |
|---|---|
| H02H 7/00 | (2006.01) |
| H01L 23/62 | (2006.01) |
| H03K 17/0814 | (2006.01) |
| H03K 17/082 | (2006.01) |
| H01L 29/16 | (2006.01) |

(52) U.S. Cl.
CPC ......... *H03K 17/0822* (2013.01); *H01L 23/62* (2013.01); *H03K 17/08142* (2013.01); *H01L 29/1608* (2013.01)

(58) Field of Classification Search
CPC .......... H03K 17/0822; H03K 17/08142; H01L 23/62
(Continued)

(56) References Cited

U.S. PATENT DOCUMENTS 5,272,399 A * 12/1993 Tihanyi .............. H03K 17/0822
                                                              327/379
9,461,640 B2   10/2016 Hiyama
(Continued)

FOREIGN PATENT DOCUMENTS

| CN | 200959511 | 10/2007 |
|---|---|---|
| TW | 201201472 | 1/2012 |
| TW | 202107816 | 2/2021 |

OTHER PUBLICATIONS

Takeshi Horiguchi et al., "A Fast Short-Circuit Protection Method Using Gate Charge Characteristics of SiC MOSFETs", 2015 IEEE Energy Conversion Congress and Exposition (ECCE), Sep. 20-24, 2015, pp. 4759-4764.

(Continued)

*Primary Examiner* — Jared Fureman
*Assistant Examiner* — Lucy M Thomas
(74) *Attorney, Agent, or Firm* — JCIPRNET (57) ABSTRACT

A short-circuit protection circuitry is adapted for a power transistor. The short-circuit protection circuitry includes a first diode, a first resistor, a voltage dividing circuit, a gate voltage generator, a pull-down circuit, and a control signal generator. The first diode is coupled to a drain of the power transistor. The first resistor is coupled between the first diode and the power transistor. The voltage dividing circuit is coupled between a gate and a source of the power transistor to generate a dividing voltage. The gate voltage generator provides a gate voltage to the gate of the power transistor according to a first driving signal and a second driving signal. The pull-down circuit pulls down the gate voltage according to a control signal. The control signal generator generates the control signal according to the first driving signal, a voltage on the anode of the first diode and the dividing voltage.

22 Claims, 7 Drawing Sheets

(58) Field of Classification Search
USPC .......................................................... 361/108
See application file for complete search history.

(56) References Cited

U.S. PATENT DOCUMENTS

2019/0260370 A1* 8/2019 Nakagawa ......... H03K 17/0822
2020/0280308 A1   9/2020 Gunasekaran et al.
2020/0382112 A1* 12/2020 Leong ................ H03K 17/6871

OTHER PUBLICATIONS

Keyao Sun et al., "Design, Analysis, and Discussion of Short circuit and Overload Gate-Driver Dual-Protection Scheme for 1.2 KV, 400 A SiC MOSFET Modules", IEEE Transactions on Power Electronics, Jul. 2019, pp. 1-16.

Karsten Fink et al., "Gate-Driver with Full Protection for SiC-MOSFET Modules", PCIM Asia 2016; International Exhibition and Conference for Power Electronics, Intelligent Motion, Renewable Energy and Energy Management, Jun. 28-30, 2016, pp. 1-7.

Diane-Perle Sadik et al., "Short-Circuit Protection Circuits for Silicon Carbide Power Transistors", IEEE Transactions on Industrial Electronics, Dec. 2015, pp. 1-10.

Jun Wang et al., "Integrated Switch Current Sensor for Shortcircuit Protection and Current Control of 1.7-kV SiC MOSFET Modules", 2016 IEEE Energy Conversion Congress and Exposition (ECCE), Sep. 18-22, 2016, pp. 1-7.

"Office Action of Taiwan Counterpart Application", issued on Feb. 23, 2023, p. 1-p. 8.

* cited by examiner

SHORT-CIRCUIT PROTECTION CIRCUITRY

CROSS-REFERENCE TO RELATED APPLICATION

This application claims the priority benefit of Taiwan application serial no. 111124378, filed on Jun. 29, 2022. The entirety of the above-mentioned patent application is hereby incorporated by reference herein and made a part of this specification.

BACKGROUND

Technical Field

The disclosure relates to a short-circuit protection circuitry, and in particular relates to a short-circuit protection circuitry for a silicon carbide power transistor.

Description of Related Art

In recent years, the technology of silicon carbide power transistors has developed rapidly and is widely used in the fields of energy conversion and distribution, avionics and automobiles, renewable energy and electric traction, etc.

In order to ensure the safety of power transistors, short-circuit protection circuitries are often used to perform protection actions when a short circuit occurs in electronic devices. However, considering the circuit cost, how to design a short-circuit protection circuitry that may respond quickly to immediately cut off the power transistor is an important issue for those skilled in the art.

SUMMARY

The disclosure provides a short-circuit protection circuitry, which may accelerate the cut-off speed of a power transistor when a short-circuit state occurs.

The short-circuit protection circuitry of the disclosure is adapted for a power transistor. The short-circuit protection circuitry includes a first diode, a first resistor, a voltage dividing circuit, a gate voltage generator, a pull-down circuit, and a control signal generator. The first diode has a cathode coupled to a drain of the power transistor. The first resistor is coupled between an anode of the first diode and a gate of the power transistor. The voltage dividing circuit is coupled between the gate of the power transistor and a source of the power transistor, and is configured to generate a dividing voltage. The gate voltage generator provides a gate voltage to the gate of the power transistor according to a first driving signal and a second driving signal. A pull-down circuit is coupled to the gate of the power transistor, and pulls down the gate voltage according to a control signal. The control signal generator generates the control signal according to the first driving signal, the voltage on the anode of the first diode and the dividing voltage.

Based on the above, the short-circuit protection circuitry of the disclosure may generate a control signal according to the short-circuit current flowing on the power transistor, and activate the pull-down circuit through the control signal to further cut off the power transistor. In an embodiment of the disclosure, a portion of the circuit of the short-circuit protection circuitry and the power transistor may also be integrated on the same integrated circuit, which may accelerate the cut-off speed of the power transistor.

DETAILED DESCRIPTION OF DISCLOSED EMBODIMENTS

Figure 1:
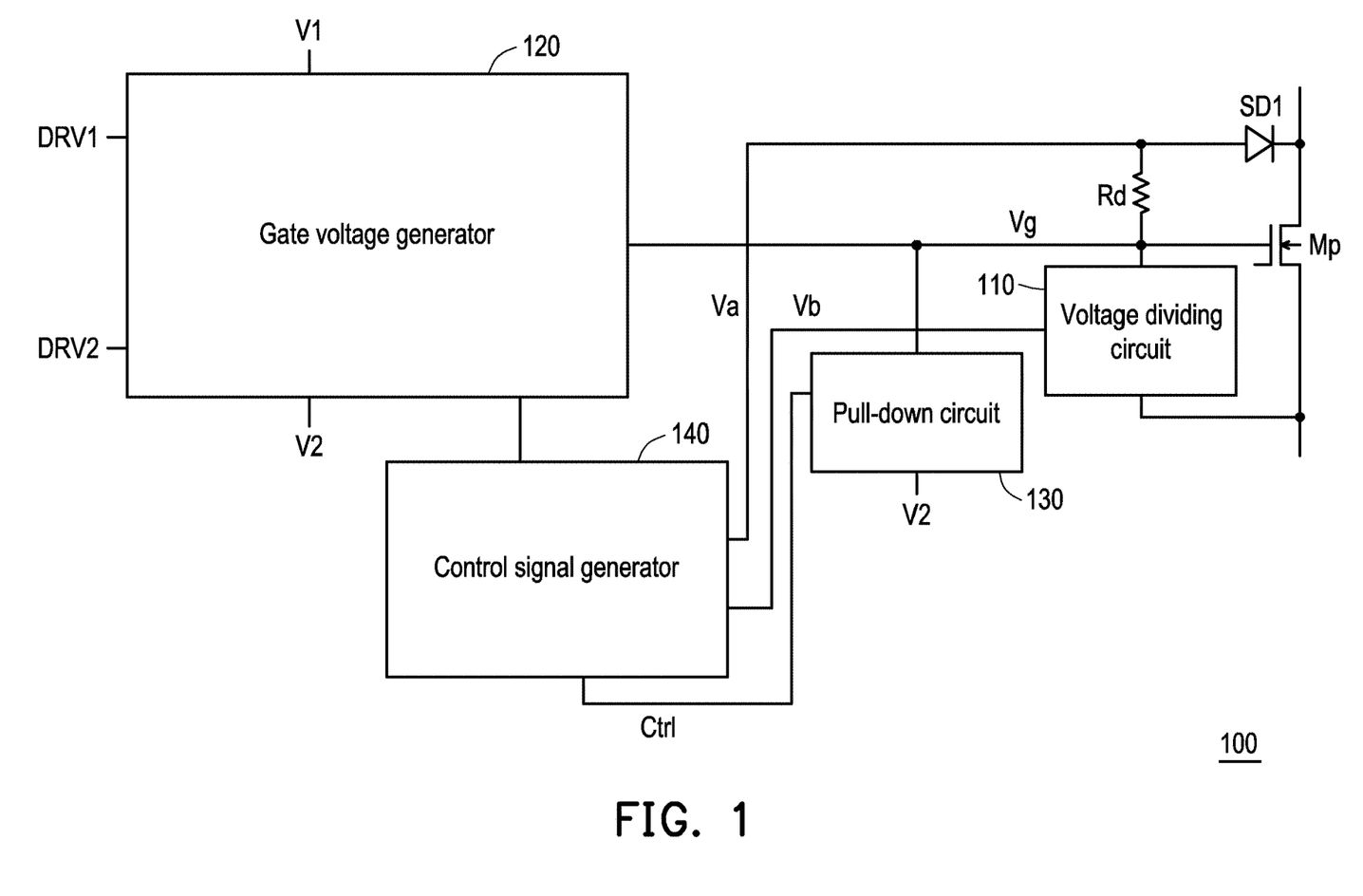
FIG. 1 is a schematic diagram of a short-circuit protection circuitry according to an embodiment of the disclosure.

Referring to FIG. 1, FIG. 1 is a schematic diagram of a short-circuit protection circuitry according to an embodiment of the disclosure. A short-circuit protection circuitry 100 includes a diode SD1, a resistor Rd, a voltage dividing circuit 110, a gate voltage generator 120, a pull-down circuit 130, and a control signal generator 140. The short-circuit protection circuitry 100 is adapted to perform a short-circuit protection action for a power transistor Mp. The cathode of the diode SD1 is coupled to the drain of the power transistor Mp, the anode of the diode SD1 is coupled to an end of the resistor Rd, and another end of the resistor Rd is coupled to the gate of the power transistor Mp. The voltage dividing circuit 110 is coupled between the gate of the power transistor Mp and the source of the power transistor Mp, and the voltage dividing circuit 110 divides the voltage difference between the gate and the source of the power transistor Mp, thereby generating a dividing voltage Vb. The gate voltage generator 120 is coupled to the gate of the power transistor Mp. The gate voltage generator 120 receives a driving signal DRV1 and a driving signal DRV2, and provides a gate voltage Vg to the gate of the power transistor Mp according to the driving signal DRV1 and the driving signal DRV2. The gate voltage generator 120 receives a voltage V1 and a voltage V2, and generates the gate voltage Vg according to the voltage V1 or the voltage V2 according to the driving signal DRV1 and the driving signal DRV2. In this embodiment, the voltage V1 is greater than the voltage V2. When the gate voltage Vg is equal to the voltage V1, the power transistor Mp may be turned on, and when the gate voltage Vg is equal to the voltage V2, the power transistor Mp may be cut off.

On the other hand, the pull-down circuit 130 is coupled to the gate of the power transistor Mp. The pull-down circuit 130 receives a control signal Ctrl, and determines whether to pull down the gate voltage Vg to the voltage V2 according to the control signal Ctrl, such that the power transistor Mp may be cut off. The control signal Ctrl is generated by the control signal generator 140. The control signal generator 140 receives the driving signal DRV1, the dividing voltage Vb, and a voltage Va on the anode of the diode SD1, and generates the control signal Ctrl according to the driving signal DRV1, the dividing voltage Vb, and the voltage Va on the anode of the diode SD1.

In this embodiment, when the power transistor Mp is turned on to perform a normal operation, in a normal state (no short circuit occurs), the control signal generator 140 may compare the dividing voltage Vb with the voltage Va on the anode of the diode SD1 to generate a comparison result, and the control signal Ctrl is generated according to the comparison result. The pull-down circuit 130 is not activated through the control signal Ctrl, and the power transistor Mp is maintained in a turned-on state. At this time, the voltage Va on the anode of the diode SD1 is less than the dividing voltage Vb.

When the short circuit occurs, the voltage Va on the anode of the diode SD1 may be greater than the dividing voltage Vb. The control signal generator 140 may generate the control signal Ctrl according to the comparison result between the voltage Va and the dividing voltage Vb, activate the pull-down circuit 130 through the control signal Ctrl, and pull down the gate voltage Vg to a voltage V2. In this way, the power transistor Mp may be cut off according to the gate voltage Vg, and the short-circuit protection action may be achieved.

It is worth mentioning that in this embodiment, the voltage dividing circuit 110, the diode SD1, the pull-down circuit 130, and the power transistor Mp may all be integrated in the same integrated circuit. In this way, when a short circuit occurs, the power transistor Mp may be quickly cut off, thereby effectively improving the efficiency of short-circuit protection.

In other embodiments of the disclosure, the power transistor Mp may be disposed on an integrated circuit, and the voltage dividing circuit 110, the diode SD1, and the pull-down circuit 130 may also be disposed outside the above-mentioned integrated circuit, which is not limit therein.

Figure 2:
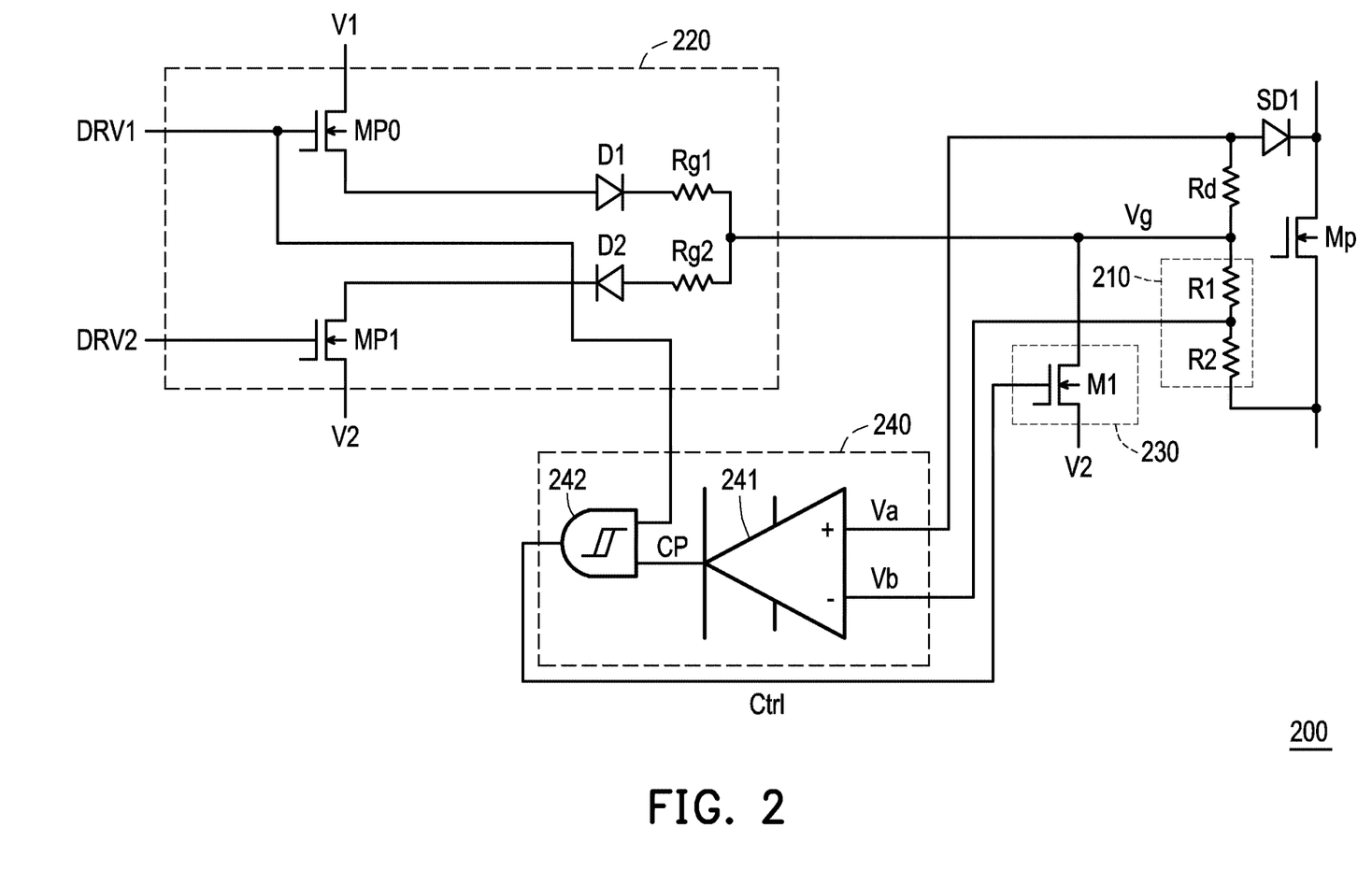
FIG. 2 is a schematic diagram of a short-circuit protection circuitry according to another embodiment of the disclosure.

Referring to FIG. 2, FIG. 2 is a schematic diagram of a short-circuit protection circuitry according to another embodiment of the disclosure. A short-circuit protection circuitry 200 includes a diode SD1, a resistor Rd, a voltage dividing circuit 210, a gate voltage generator 220, a pull-down circuit 230, and a control signal generator 240. The short-circuit protection circuitry 200 is adapted to perform a short-circuit protection action for the power transistor Mp. In this embodiment, the gate voltage generator 220 includes a transistor MP0, a transistor M3, a diode D1, a diode D2, a resistor Rg1, and a resistor Rg2. The first end of the transistor MP0 receives a voltage V1; the control end of the transistor MP0 receives the driving signal DRV1; the second end of the transistor MP0 is coupled to the anode of the diode D1. The cathode of the diode D1 is coupled to the resistor Rg1, and the other end of the resistor Rg1 is coupled to the gate of the power transistor Mp. In addition, the first end of the transistor MP1 receives the voltage V2; the control end of the transistor MP1 receives the driving signal DRV2; the second end of the transistor MP1 is coupled to the cathode of the diode D2. The anode of the diode D2 is coupled to the resistor Rg2, and the other end of the resistor Rg2 is coupled to the gate of the power transistor Mp. The coupled end of the resistor Rg1 and the resistor Rg2 are used to provide the gate voltage Vg, and the voltage V1 is greater than the voltage V2.

In this embodiment, the control signal generator 240 includes a comparator 241 and a logic circuit 242. The comparator 241 is used for comparing the voltage Va on the anode of the diode SD1 and the dividing voltage Vb generated by the voltage dividing circuit 210 to generate a comparison result CP. The logic circuit 242 is coupled to the comparator 241, performs logic operations based on the comparison result CP and the driving signal DRV1, and generates the control signal Ctrl. In this embodiment, the logic circuit 242 may be an AND gate of a Schmitt trigger structure.

In addition, the pull-down circuit 230 includes a transistor M1. An end of the transistor M1 is coupled to the gate of the power transistor Mp; another end of the transistor M1 receives the voltage V2; the control end of the transistor M1 receives the control signal Ctrl. The voltage dividing circuit 210 includes a resistor R1 and a resistor R2 connected in series. The resistor R1 and the resistor R2 are connected in series between the gate and the source of the power transistor Mp.

Regarding the operation details of the short-circuit protection circuitry 200, when the power transistor Mp is to be cut off, the transistor MP0 may be cut off according to the driving signal DRV1, and the transistor MP1 may be turned on according to the driving signal DRV2. In such a case, the transistor MP1 may generate the gate voltage Vg according to the voltage V2 having a relatively low voltage value, and cut off the power transistor Mp. In addition, when the power transistor Mp is to be turned on, the transistor MP0 may be turned on according to the driving signal DRV1, and the transistor MP1 may be cut off according to the driving signal DRV2. In such a case, the transistor MP0 may generate the gate voltage Vg according to the voltage V1 having a relatively high voltage value, and turn on the power transistor Mp.

On the other hand, when the power transistor Mp is turned on, if no short circuit occurs, the voltage difference between the drain and the source of the power transistor Mp may be, for example, between 2 to 5 volts according to the size of the driven load. Taking the gate voltage Vg equal to 20 volts as an example, the diode SD1 may be turned on at this time. In this embodiment, the diode SD1 may be a Schottky diode and provide a voltage drop of about two volts. In this way, the voltage Va on the anode of the diode SD1 may be approximately equal to 4 to 7 volts. In the voltage dividing circuit 210, the resistor R1 and the resistor R2 divide the voltage according to the voltage difference between the gate voltage Vg and the voltage on the source of the power transistor Mp. The resistor R2 is three times the resistor R1 as an example. The voltage Vb may be approximately equal to 15 volts.

According to the above, the comparator 241 compares the voltage Va with the dividing voltage Vb, and may generate the comparison result CP which is a logic low level. The logic circuit 242 may correspondingly generate the control signal Ctrl at a logic low level, and not activate the pull-down circuit 230. The power transistor Mp may be maintained in a turned-on state.

When the power transistor Mp is turned on and a short-circuit, the short-circuit current flows through the power transistor Mp, and the voltage difference between the drain and the source of the power transistor Mp is greater than or equal to the voltage difference between the gate and the source of the power transistor Mp. In such a case, the diode SD1 is in a reverse biased state, and the voltage Va on its anode may be equal to the gate voltage Vg (e.g., equal to 20 volts). In addition, the voltage dividing circuit 210 may generate a dividing voltage Vb equal to, for example, volts. In this way, the comparator 241 compares the voltage Va with the dividing voltage Vb, and may generate the comparison result CP which is a logic high level. The logic circuit 242 may generate the control signal Ctrl which is a logic high level according to the driving signal DRV1 which is the same logic high level and the comparison result CP, and activate the pull-down circuit 230 to pull down the gate voltage Vg to the voltage V2. After the gate voltage Vg is pulled down, the power transistor Mp may be cut off to achieve the effect of short-circuit protection.

It is worth mentioning that the voltage values mentioned in the above-mentioned actions are only examples for illustration, which does not mean that the present embodiment must work within the above-mentioned voltage values or voltage ranges. The designer may adjust the voltage value and voltage range according to the actual situation and the requirements of the specification, and there are no specific restrictions.

Figure 3:
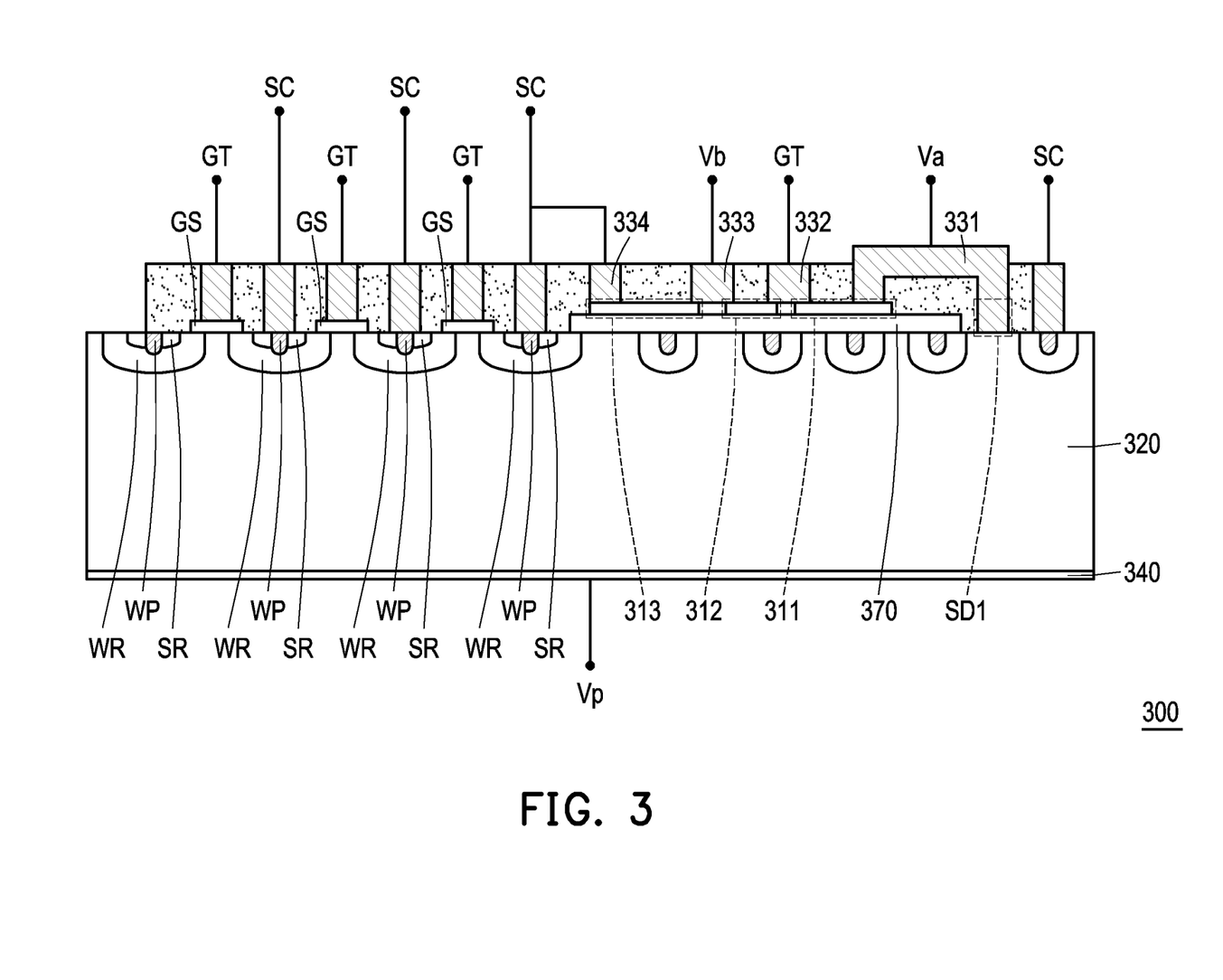
FIG. 3 is a schematic diagram of an integrated circuit integrating a power transistor and a portion of a short-circuit protection circuitry according to an embodiment of the disclosure.

Referring to FIG. 3, FIG. 3 is a schematic diagram of an integrated circuit integrating a power transistor and a portion of a short-circuit protection circuitry according to an embodiment of the disclosure. FIG. 3 is a cross-sectional diagram of an integrated circuit 300. The integrated circuit 300 has a substrate 320. Multiple well regions WR are formed on the substrate 320. A source region SR and a well pickup region WP are also formed in each of the well regions WR. The source region SR is used to form the source of the power transistor and is electrically connected to a source SC. Between the adjacent source regions SR, there are a plurality of gate structures GS to form the gates of the power transistors. These gate structures GS are commonly electrically connected to the gate GT. The lower surface of the substrate 320 is coupled to the conductive layer 340. The conductive layer 340 is used to form the drain of the power transistor and receive a power supply voltage VP.

In addition, an insulating structure 370 is formed on the upper surface of the substrate 320. The insulating structure 370 forms a plurality of conductive structures 311, 312 and 313. The conductive structure 311 is used to form the resistor Rd in the embodiment of FIG. 2, and the conductive structure 312 and the conductive structure 313 are respectively used to form the resistor R1 and the R2 in the embodiment of FIG. 2. In addition, an end of the conductive structure 313 is electrically connected to the source SC of the power transistor through a metal structure 334; anther end of the conductive structure 313 is electrically connected to an end of the conductive structure 312 through a metal structure 333; another end of the conductive structure 312 is electrically connected to an end of the conductive structure 311 and the gate of the power transistor through a metal structure 332. In addition, another end of the conductive structure 311 is electrically connected to the surface of the substrate 320 through a metal structure 331. On the premise that the power transistor is a silicon carbide transistor, a Schottky diode may be formed on the connection surface between the metal structure 331 and the substrate 320, that is, the diode SD1 in the embodiment of FIG. 2.

Incidentally, the dividing voltage Vb may be generated on the metal structure 333, and the metal structure 331 is the anode of the diode SD1 and may provide the voltage Va.

It may be known from the above description that the short-circuit protection circuitry, the diode SD1, the resistor connected between the gate of the power transistor and the diode SD1, and the voltage dividing circuit of the embodiment of the disclosure may be integrated and designed with the power transistor in the same integrated circuit 300, which may effectively improve the speed at which the transistor turns on and cuts off. In this way, when a short circuit occurs, the short-circuit protection circuitry of the embodiment of the disclosure may quickly cut off the power transistor, thereby reducing the possibility of damage to the electronic components in the electronic device.

Figure 4:
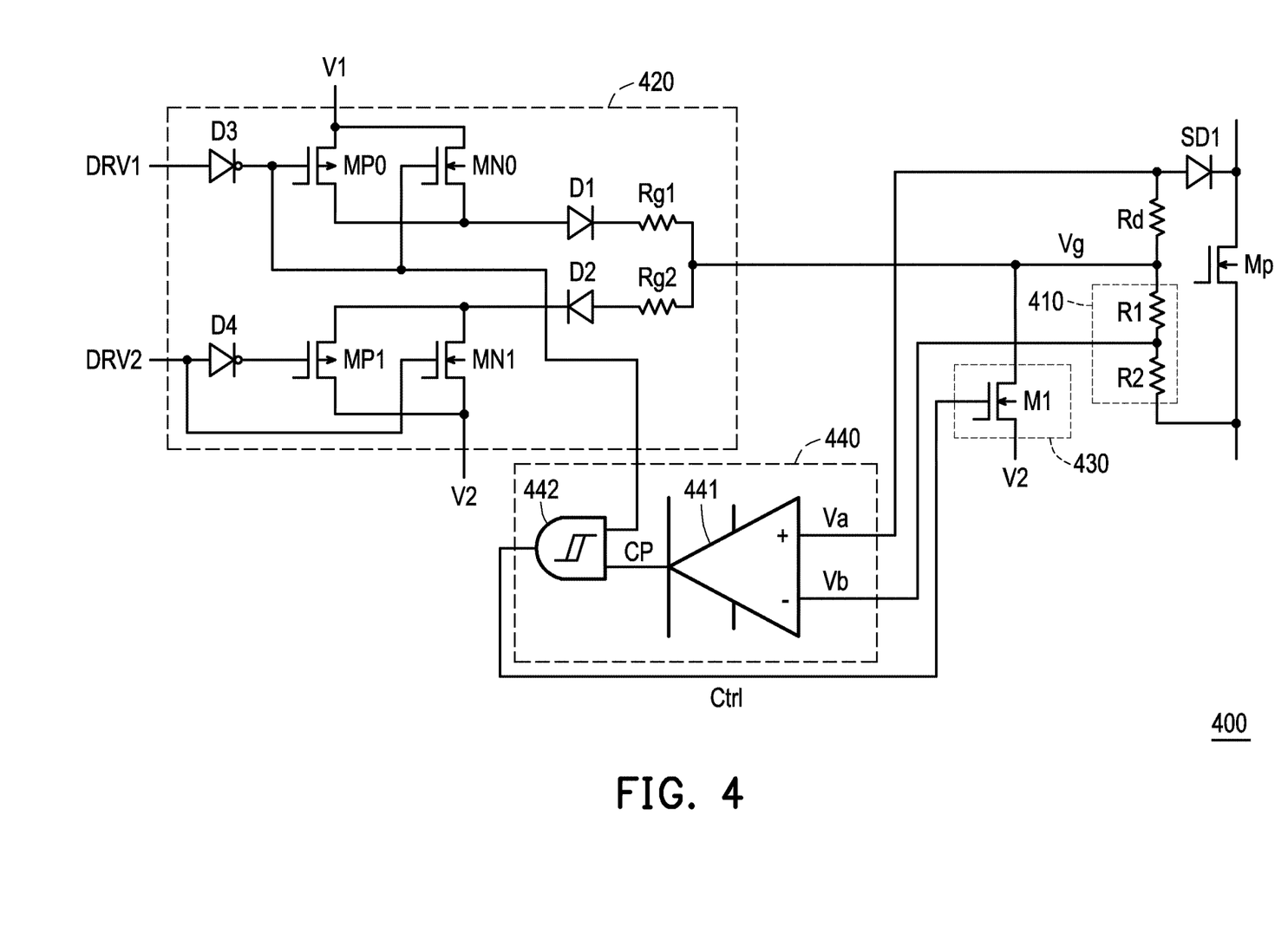
FIG. 4 to FIG. 7 are schematic diagrams of short-circuit protection circuitries according to various embodiments of the disclosure.

Referring to FIG. 4, FIG. 4 is a schematic diagram of a short-circuit protection circuitry according to another embodiment of the disclosure. A short-circuit protection circuitry 400 includes a diode SD1, a resistor Rd, a voltage dividing circuit 410, a gate voltage generator 420, a pull-down circuit 430, and a control signal generator 440. The short-circuit protection circuitry 400 has a similar structure to the short-circuit protection circuitry 200 in the embodiment of FIG. 2. The components with the same reference numerals are the same components, which are not repeated herein.

Different from the short-circuit protection circuitry 200 in the embodiment of FIG. 2, in this embodiment, the gate voltage generator 420 further includes a transistor MN0, a transistor MN1, a diode D3, and a diode D4. The anode of the diode D3 receives the driving signal DRV1, and the cathode of the diode D3 is coupled to the control end of the transistor MP0. The anode of the diode D4 receives the driving signal DRV2, and the cathode of the diode D4 is coupled to the control end of the transistor MP1. In addition, the transistor MN0 is coupled in parallel with the transistor MP0, and the transistor MN1 is coupled in parallel with the transistor MP1. The transistor MN0 and the transistor MN1 are N-type transistors, and the transistor MP0 and the transistor MP1 may be P-type transistors. The control end of the transistor MP0 is coupled to the cathode of the diode D3; the control end of the transistor MP1 is coupled to the anode of the diode D3; the control end of the transistor MN0 is coupled to the cathode of the diode D4; the control end of the transistor MN1 is coupled to the anode of the diode D4.

Figure 5:
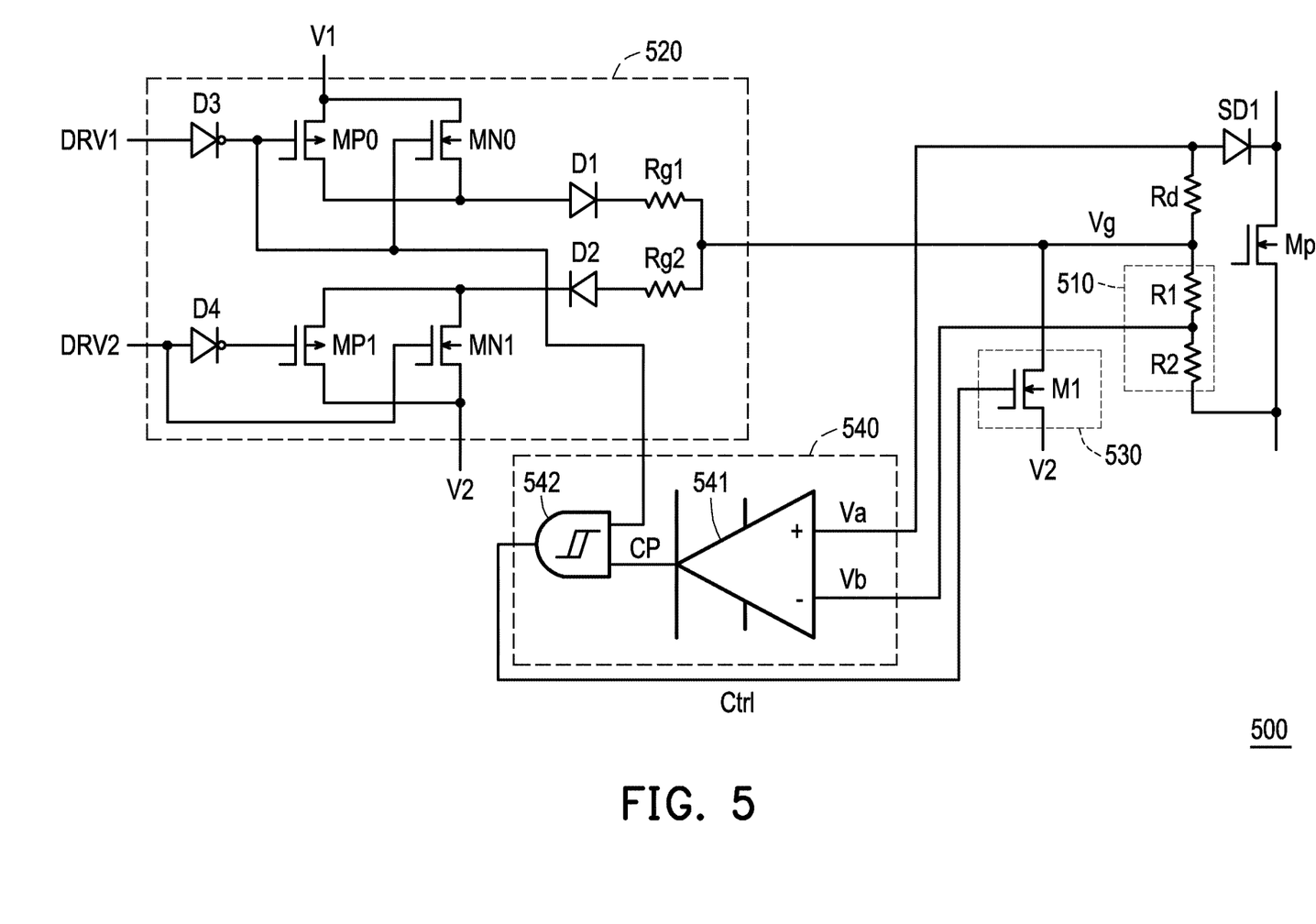

Referring to FIG. 5, FIG. 5 is a schematic diagram of a short-circuit protection circuitry according to another embodiment of the disclosure. A short-circuit protection circuitry 500 includes a diode SD1, a resistor Rd, a voltage dividing circuit 510, a gate voltage generator 520, a pull-down circuit 530, and a control signal generator 540. The short-circuit protection circuitry 500 has a similar structure to the short-circuit protection circuitry 400 in the embodiment of FIG. 4. The components with the same reference numerals are the same components, which are not repeated herein.

Different from the short-circuit protection circuitry 400 in the embodiment of FIG. 4, in this embodiment, in the gate voltage generator 520, the control ends of the transistor MP0 and the transistor MN0 are both coupled to the cathode of the diode D3 to receive the driving signal DRV1.

Figure 6:
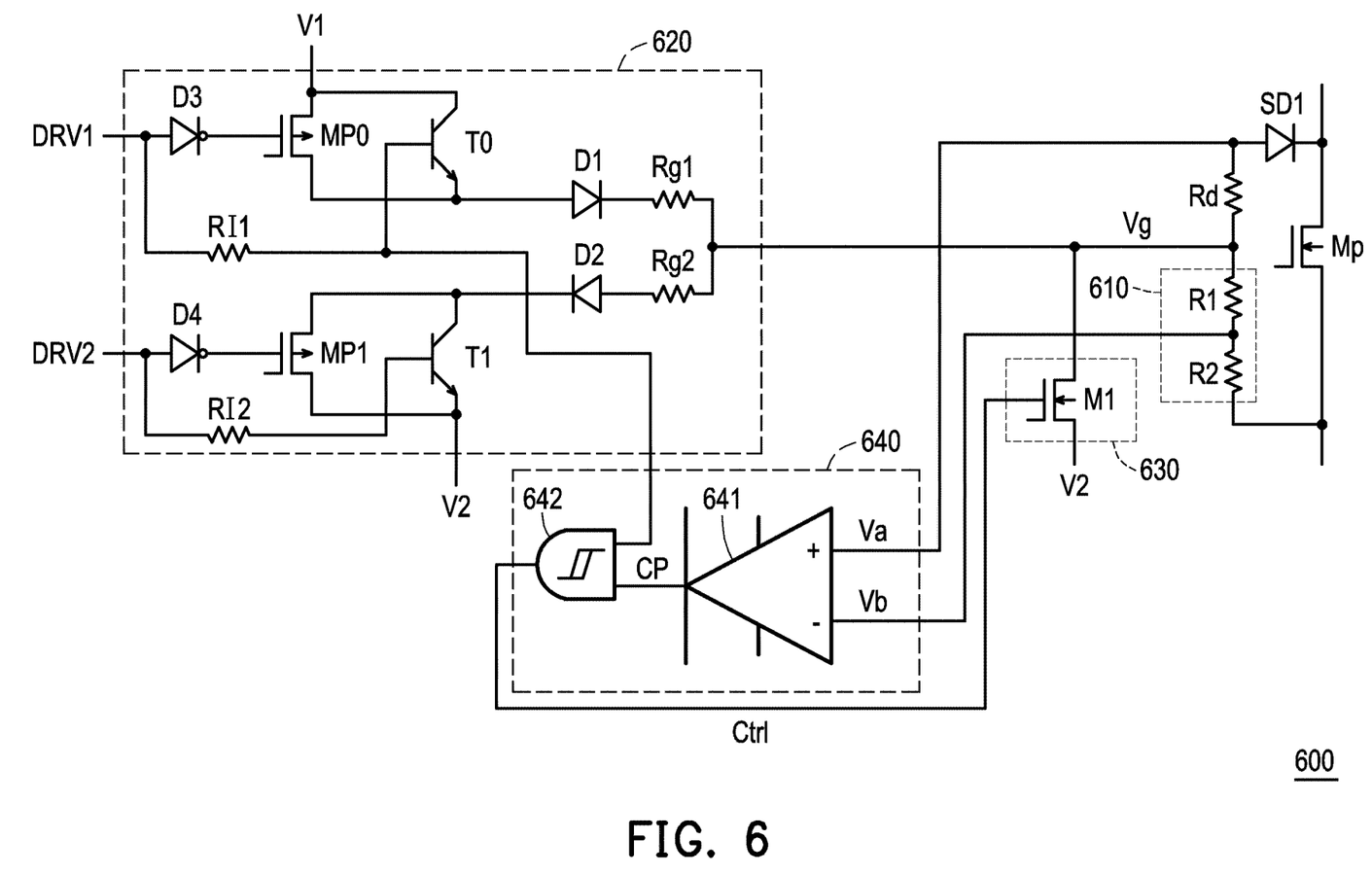

Referring to FIG. 6, FIG. 6 is a schematic diagram of a short-circuit protection circuitry according to another embodiment of the disclosure. A short-circuit protection circuitry 600 includes a diode SD1, a resistor Rd, a voltage dividing circuit 610, a gate voltage generator 620, a pull-down circuit 630, and a control signal generator 640. The short-circuit protection circuitry 600 has a similar structure to the short-circuit protection circuitry 400 in the embodiment of FIG. 4. The components with the same reference numerals are the same components, which are not repeated herein.

Different from the short-circuit protection circuitry 400 in the embodiment of FIG. 4, in this embodiment, the gate voltage generator 620 further includes a resistor RI1 and a resistor RI2. The transistor MN0 and the transistor MN1 in FIG. 4 are respectively replaced by a transistor T0 and a transistor T1. The control end (base) of the transistor T0 may be coupled to the anode of the diode D3 through the resistor RI1, and the control end (base) of the transistor T1 may be coupled to the anode of the diode D4 through the resistor RI2.

In this embodiment, the transistor T0 and the transistor T1 may be NPN bipolar junction transistors.

Figure 7:
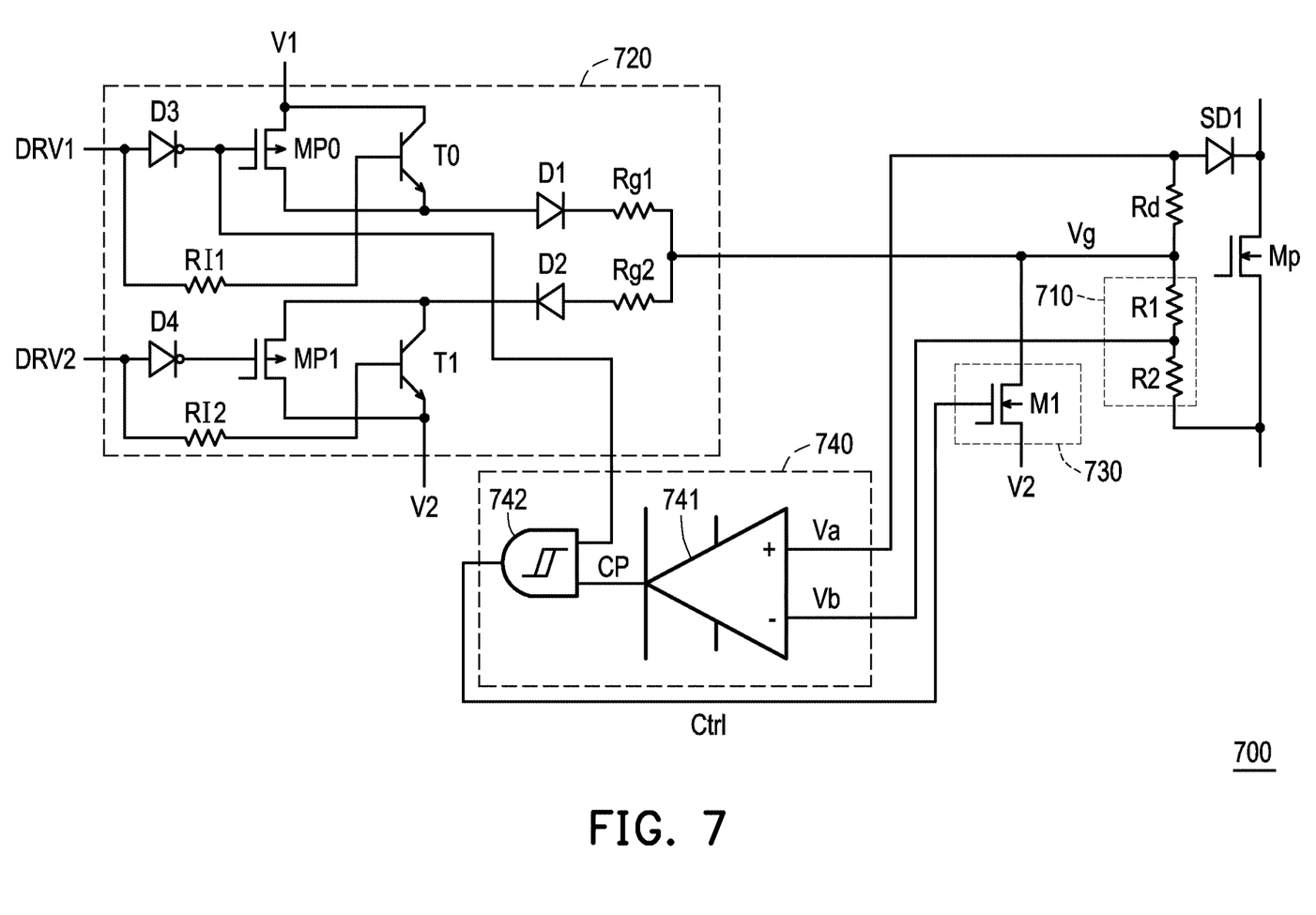

Referring to FIG. 7, FIG. 7 is a schematic diagram of a short-circuit protection circuitry according to another embodiment of the disclosure. A short-circuit protection circuitry 700 includes a diode SD1, a resistor Rd, a voltage dividing circuit 710, a gate voltage generator 720, a pull-down circuit 730, and a control signal generator 740. The short-circuit protection circuitry 700 has a similar structure to the short-circuit protection circuitry 600 in the embodiment of FIG. 6. The components with the same reference numerals are the same components, which are not repeated herein.

In this embodiment, the control signal generator 740 is coupled to the cathode of the diode D3, and the gate voltage generator 720 transmits the driving signal DRV1 to the control signal generator 740 through the cathode of the diode D3. In this way, the influence of the noise on the driving signal DRV1 on the operation of the control signal generator 740 may be reduced.

To sum up, the short-circuit protection circuitry of the disclosure may respond quickly to the short-circuit current to cut off the power transistor when a short circuit occurs. Thereby reducing the possibility of damage to circuit components due to a short-circuit current, and improving the safety of electronic devices.

What is claimed is:

1. A short-circuit protection circuitry, adapted for a power transistor, comprising:
   a first diode, having a cathode coupled to a drain of the power transistor;
   a first resistor, coupled between an anode of the first diode and a gate of the power transistor;
   a voltage dividing circuit, coupled between the gate of the power transistor and a source of the power transistor, generating a dividing voltage;
   a gate voltage generator, providing a gate voltage to the gate of the power transistor according to a first driving signal and a second driving signal;
   a pull-down circuit, coupled to the gate of the power transistor, pulling down the gate voltage according to a control signal; and
   a control signal generator, generating the control signal according to the first driving signal, the voltage on the anode of the first diode and the dividing voltage.

2. The short-circuit protection circuitry according to claim 1, wherein the voltage dividing circuit, the first diode, the pull-down circuit, and the power transistor are integrated in a same integrated circuit.

3. The short-circuit protection circuitry according to claim 1, wherein the power transistor is disposed on an integrated circuit, and the voltage dividing circuit, the first diode, and the pull-down circuit are disposed outside the integrated circuit.

4. The short-circuit protection circuitry according to claim 1, wherein the voltage dividing circuit divides a voltage difference between the gate and the source of the power transistor to generate the dividing voltage.

5. The short-circuit protection circuitry according to claim 3, wherein the voltage dividing circuit comprises a second resistor and a third resistor connected in series.

6. The short-circuit protection circuitry according to claim 5, wherein the integrated circuit comprises:
   a substrate;
   an insulating structure, disposed on a surface of the substrate;
   a first conductive structure, disposed on the insulating structure, wherein the first conductive structure forms the first resistor;
   a second conductive structure, disposed on the insulating structure, wherein the second conductive structure forms the second resistor;
   a third conductive structure, disposed on the insulating structure, wherein the third conductive structure forms the third resistor; and
   a first metal structure, coupled between a first end of the first conductive structure and the surface of the substrate, wherein the first metal structure and the substrate form the first diode.

7. The short-circuit protection circuitry according to claim 6, wherein the integrated circuit comprises:
   a second metal structure, coupled between a second end of the first conductive structure and a first end of the second conductive structure;
   a third metal structure, coupled between a second end of the second conductive structure and a first end of the third conductive structure; and
   a fourth metal structure, coupled between a second end of the third conductive structure and the source of the power transistor,
   wherein the second metal structure is couple to the gate of the power transistor.

8. The short-circuit protection circuitry according to claim 1, wherein in a first mode, the gate voltage generator provides the gate voltage equal to a first voltage according to the first driving signal and the second driving signal such that the power transistor is turned on.

9. The short-circuit protection circuitry according to claim 8, wherein in a second mode, the gate voltage generator provides the gate voltage equal to a second voltage according to the first driving signal and the second driving signal such that the power transistor is cut off, wherein the first voltage is greater than the second voltage.

10. The short-circuit protection circuitry according to claim 1, wherein the gate voltage generator comprises:
    a first transistor, having a first end that receives a first voltage, a control end of the first transistor receiving the first driving signal;
    a second transistor, having a first end that receives a second voltage, a control end of the second transistor receiving the second driving signal;
    a second diode, having an anode coupled to a second end of the first transistor;
    a third diode, having a cathode coupled to a second end of the second transistor;
    a second resistor, having a first end coupled to a cathode of the second diode, a second end of the second resistor coupled to the gate of the power transistor to provide the gate voltage; and
    a third resistor, coupled between a second end of the second resistor and an anode of the third diode,
    wherein the first voltage is greater than the second voltage.

11. The short-circuit protection circuitry according to claim 10, wherein the gate voltage generator further comprises:
    a third transistor, connected in parallel with the first transistor; and
    a fourth transistor, connected in parallel with the second transistor,
    wherein a conductive polarity of the third transistor is opposite to a conductive polarity of the first transistor, and a conductive polarity of the fourth transistor is opposite to a conductive polarity of the second transistor.

12. The short-circuit protection circuitry according to claim 11, wherein the gate voltage generator further comprises:
    a fourth diode, having an anode that receives the first driving signal, a cathode of the fourth diode coupling to the gate of the first transistor;

a fifth diode, having an anode that receives the second driving signal, a cathode of the fifth diode coupling to the gate of the second transistor,
wherein a control end of the fourth transistor is coupled to the anode of the fifth diode.

13. The short-circuit protection circuitry according to claim 12, wherein a control end of the third transistor is coupled to the anode of the fourth diode.

14. The short-circuit protection circuitry according to claim 12, wherein the gate voltage generator further comprises:
a fourth resistor, coupled between the anode of the fourth diode and a control end of the third transistor; and
a fifth resistor, coupled between the anode of the fifth diode and a control end of the fourth transistor,
wherein the third transistor and the fourth transistor are bipolar junction transistors.

15. The short-circuit protection circuitry according to claim 12, wherein the anode or the cathode of the fourth diode provides the first driving signal to the control signal generator.

16. The short-circuit protection circuitry according to claim 1, wherein the control signal generator comprises:
a comparator, comparing the voltage on the anode of the first diode and the dividing voltage to generate a comparison result; and
a logic circuit, performing a logic operation based on the comparison result and the first driving signal to generate the control signal.

17. The short-circuit protection circuitry according to claim 16, wherein the logic circuit is an AND gate of a Schmitt trigger structure.

18. The short-circuit protection circuitry according to claim 16, wherein when the voltage on the anode of the first diode is greater than the dividing voltage, and first driving signal is a logic high level, the control signal generator generates the control signal to enable the pull-down circuit.

19. The short-circuit protection circuitry according to claim 1, wherein power transistor is silicon carbide transistor.

20. The short-circuit protection circuitry according to claim 1, wherein the pull-down transistor comprises:
a transistor, having a first end coupled to the gate of the power transistor, a second end of the transistor receiving a voltage, a control end of the transistor receiving the control signal.

21. The short-circuit protection circuitry according to claim 1, wherein when a short circuit occurs, the control signal generator generates the control signal to activate the pull-down circuit, and the pull-down circuit pulls down the gate voltage according to the control signal such that the power transistor is cut off.

22. The short-circuit protection circuitry according to claim 1, wherein the first diode is a Schottky diode.

* * * * *